United States Patent [19]
Nellissen

[11] Patent Number: 5,686,230
[45] Date of Patent: Nov. 11, 1997

[54] METHOD OF MANUFACTURING A DEVICE, BY WHICH METHOD VARIOUS PARTS OF A BODY ARE BROUGHT INTO A PATTERN

[75] Inventor: Antonius J. M. Nellissen, Eindhoven, Netherlands

[73] Assignee: U.S. Philips Corporation, New York, N.Y.

[21] Appl. No.: 423,243

[22] Filed: Apr. 13, 1995

[30]  Foreign Application Priority Data

Apr. 15, 1994 [EP] European Pat. Off. .............. 94201028

[51] Int. Cl.$^6$ ................................ G03F 7/24; G03F 7/20
[52] U.S. Cl. ..................... 430/395; 355/47; 355/48; 355/49
[58] Field of Search ................... 430/395, 29; 355/47, 355/48, 49

[56] References Cited

U.S. PATENT DOCUMENTS

| | | | |
|---|---|---|---|
| 3,614,225 | 10/1971 | Dinella et al. | 355/85 |
| 3,645,178 | 2/1972 | Speicher | 95/1 |
| 3,645,179 | 2/1972 | Karol | 95/1 |
| 4,151,040 | 4/1979 | Schiffman | 156/659 |
| 5,147,760 | 9/1992 | Hoshinoughi et al. | 430/296 |
| 5,168,624 | 12/1992 | Shirai | 29/846 |
| 5,461,455 | 10/1995 | Coteus et al. | 355/43 |

FOREIGN PATENT DOCUMENTS 0784761  10/1957  United Kingdom ................... 430/315

OTHER PUBLICATIONS

Thomas Richter et al, "Comparing UV Exposure Systems for PCBs", *Circuits Manufacturing*, vol. 19, No. 11, Nov. 1979, pp. 69, 117–119.

"UV Exposure Systems", *Circuits Manufacturing*, May 1978, vol. 18, No. 5, pp. 45–48.

Primary Examiner—Cynthia Hamilton
Attorney, Agent, or Firm—Michael E. Marion

[57] ABSTRACT

A method of manufacturing a device provided with a body with a surface, at least a portion of the surface being provided with a radiation-sensitive layer, after which portions of the radiation-sensitive layer are exposed to radiation through a mask, a first portion of the layer being irradiated directly using a first part of a radiation beam projected through the mask and a second portion of the layer being irradiated indirectly using a second part of the radiation beam projected through the mask and reflected onto the second portion, the radiation beam being substantially collimated.

9 Claims, 3 Drawing Sheets

METHOD OF MANUFACTURING A DEVICE, BY WHICH METHOD VARIOUS PARTS OF A BODY ARE BROUGHT INTO A PATTERN

BACKGROUND OF THE INVENTION

The invention relates to a method of manufacturing a device provided with a body having a surface, where a radiation-sensitive layer is present on at least a portion of the surface and portions of the radiation-sensitive layer are irradiated with radiation through a mask.

U.S. Pat. No. 5,168,624 discloses a method of the kind mentioned in the opening paragraph whereby a printed circuit board with a complicated three-dimensional shape is manufactured. Conductor patterns are provided on the printed circuit board at an upper and a lower side. For this purpose, a photosensitive layer is provided on a conductive layer by means of electrodeposition. This photosensitive layer is illuminated through an upper and a lower mask, developed and patterned. The photosensitive layer thus patterned is used for bringing the conductive layer into a pattern by means of etching.

The known method described has the disadvantage that several masks are used. These masks are to be manufactured and are to be aligned relative to the body. This renders the method complicated and expensive.

SUMMARY OF THE INVENTION

The invention has for its object inter alia to counteract said disadvantage.

According to the invention, the method is for this purpose characterized in that a portion of the radiation-sensitive layer is irradiated directly through the mask, while another portion is irradiated indirectly via the mask and a surface which reflects the radiation. The directly and indirectly irradiated portions may be irradiated either simultaneously or consecutively.

It is achieved thereby that various portions of the radiation-sensitive layer can be exposed by means of one mask. The alignment of one mask and of a reflecting surface is simpler because the reflecting surface is positioned with a greater freedom than a mask on account of the absence of a pattern.

Such a method is particularly suitable for the manufacture of devices in which bodies are used such as, for example, printed circuit boards, connection foils of, for example, ICs in the TAB (Tape Automated Bonding) technology, connection foils of printed circuit boards, or adapter plates which have a different conductor pattern at the upper and at the lower side, the pattern at the one side being connected through to the pattern at the other side, for example for the adaptation of a pitch between ICs or between printed circuit boards, or between printed circuit boards and ICs. It is also possible to change the optical properties of bodies by means of the method in that, for example, different sides of a body are provided with specific patterns whereby, for example, the light transmission or on the contrary the light reflection changes. In the method, potions of these bodies are provided, for example, with a pattern of conductive or insulating tracks or with an inscription. The body on which the pattern is provided may then exhibit a three-dimensional (3-D) relief or have a shape such as, for example, a spherical shape. In the method, a portion of the surface of the body is provided with a radiation-sensitive layer which is sensitive to such radiation as, for example, electrons, X-rays, or light. Portions of the radiation-sensitive layer, for example, at a lower side, lateral side, or upper side of the body, are irradiated through a mask. The properties of the radiation-sensitive layer change owing to the radiation, so that this layer becomes sensitive to certain development methods. Irradiated or non-irradiated portions of the radiation-sensitive layer are removed then, for example by dissolving in certain chemical solvents in the case of positive or negative radiation-sensitive layers, respectively. The radiation-sensitive layer has thus been patterned. The patterned radiation-sensitive layer may subsequently be advantageously used for carrying out a treatment for the removal of material. Thus a layer which is conductive, non-conductive, or impermeable to light may have been provided on the surface below the radiation-sensitive layer and may be patterned by means of the patterned radiation-sensitive layer, so that conductive, insulating, or light-impermeable tracks are created on the surface. Patterning may take place, for example, by techniques such as etching of portions of the conductive, insulating, or light-impermeable layer not covered by the radiation-sensitive layer. Alternatively, the patterned radiation-sensitive layer may be used for providing a pattern of, for example, conductive, insulating or light-impermeable tracks by means of known techniques such as selective deposition on portions of the surface of the body not covered by the layer, or by lift-off.

In the method according to the invention, a distance between mask and surface covered by the radiation during direct irradiation of the body is usually not equal to a distance covered by the radiation during indirect irradiation of the surface, i.e. a distance situated between the mask, the reflecting surface, and the surface to be irradiated indirectly. Preferably, the radiation comprises a substantially parallel beam. The differences in distance covered by the radiation in direct and indirect irradiation then do not or substantially not give rise to differences in resolution between directly and indirectly irradiated portions of the radiation-sensitive layer. Preferably, a collimation angle of the radiation is smaller than 1°. In practice, no problems with resolution differences are found to arise then.

In the method, a portion of a radiation-sensitive layer is exposed to radiation. Radiation which may be used is, for example, electrons, photons, or X-rays. Irradiation systems known per se and designed for the specific radiation are then used, such as masks, reflecting surfaces, and radiation-sensitive layers with the accompanying development systems. Preferably, the method according to the invention is characterized in that the radiation is optical radiation and the reflecting surface comprises a mirror. "Optical radiation" is here understood to mean infrared, visible, or ultraviolet light. The technique of exposing a light-sensitive layer to optical radiation (photons) through a mask is comparatively highly perfected, so that illumination systems, light-sensitive materials for the radiation-sensitive layer, development systems for exposed or non-exposed portions of the light-sensitive layer and aftertreatments (baking of the photosensitive layer) are available.

Preferably, the method according to the invention is characterized in that the portions of the radiation-sensitive layer which are irradiated are provided on an upper and an opposed lower side of the body, while the mask is adjacent the one side and the reflecting surface is adjacent the other side, the radiation being incident on the mask and on the reflecting surface at an angle. The portion of the mask used for irradiating the one side directly is situated above the one side, while the mask extends to laterally of the body. The portion of the mask laterally of the body is used for irradiating the other side via the reflecting surface. It is achieved thereby that the upper and lower side of the body can be patterned in a simple manner.

An additional advantage is obtained when the mask and the reflecting surface are substantially parallel. Aligning the mask and the reflecting surface is comparatively simple then.

An additional advantage is obtained when the body is provided with a lateral side which connects the upper and lower sides, while this lateral side is also provided with a radiation-sensitive layer which is irradiated through the mask or via the reflecting surface and brought into a pattern. It is possible then to provide patterns on the body which extend continuously from the lower side over a lateral side to the upper side of the body. This offers major advantages in the creation of conductor tracks which extend from the upper side over a lateral side to a lower side.

Preferably, the mask comprises a pattern which runs mainly in one direction, while radiation is thrown onto the surface from more than one direction parallel in projection to the direction of the pattern. The expression "parallel in projection" is here understood to mean that a projection onto the mask of the path travelled by the radiation runs parallel to the pattern direction. The radiation is as it were in a plane parallel to the direction of the pattern. It is possible then, for example, to manufacture many parallel conductor tracks which run from an upper side over a lateral side to a lower side of the body. The radiation is thrown onto the mask and the reflecting surface from various directions, for example, in order to make a continuous conductor track at a left-hand and right-hand side of a body. Since the radiation is made to run parallel to the direction of the pattern from various directions during irradiation, substantially no widening of the pattern takes place. Preferably, the body has an elongate shape, while the direction of the pattern on the mask is substantially perpendicular to the longitudinal direction of the body. Owing to the elongate shape, the dimensions of the body in the direction of the pattern on the mask are comparatively small. A pattern may then be readily provided both on an upper side and on a lower side of the body. Advantageously, a coil is made by the method through the use of the radiation-sensitive layer patterned on an elongate body for manufacturing a conductor track which extends over the upper, lower, and lateral sides of the body and surrounds the body helically. The mask then comprises a pattern of parallel lines which are offset in one location. Owing to this offset, a continuous conductor track arises on the body which may act as the winding of a coil. Provided a suitable mask is used, many coils can be manufactured simultaneously, so that the method is less expensive than a conventional method whereby coils are manufactured by coiling a wire around a body. In addition, coils of very small dimensions, which cannot be made by the conventional method, can be manufactured by the method according to the invention.

BRIEF DESCRIPTION OF THE DRAWINGS

The invention will be explained in more detail below by way of example with reference to the drawing, in which.

The Figures are purely diagrammatic and not drawn to scale. Corresponding components have generally been given the same reference numerals in the Figures.

DETAILED DESCRIPTION OF THE PREFERRED EMBODIMENTS

Figure 1:
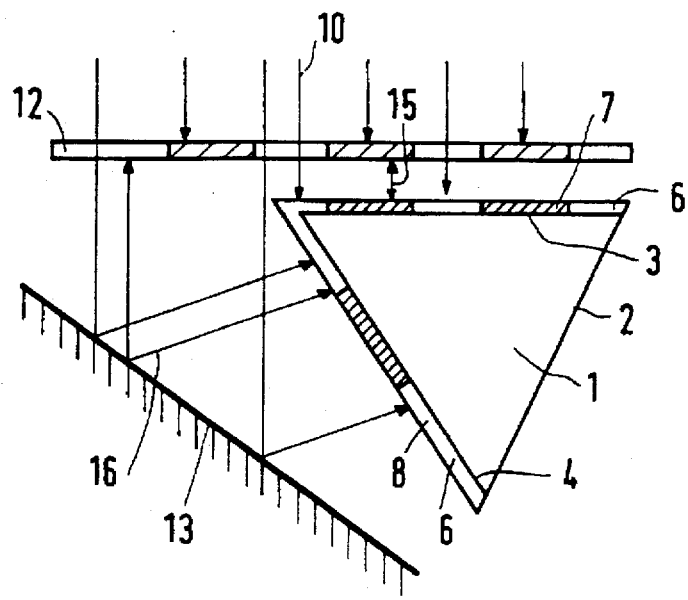
FIG. 1 is a lateral view of the method according to the invention whereby a radiation-sensitive layer on a prism is irradiated.

FIG. 1 shows a method of manufacturing a device provided with a body 1 having a surface 2, at least a portion 3, 4 of the surface being provided with a radiation-sensitive layer 6, after which portions 7, 8 of the radiation-sensitive layer 6 are irradiated with radiation 10 through a mask 12 and brought into a pattern.

The manufacture of a printed circuit board with a complicated three-dimensional (3-D) shape is known. Conductor patterns are provided on the printed circuit board at an upper and a lower side. For this purpose, a photosensitive layer 6 is provided by electrodeposition on a conductive layer which was provided over the entire surface. This photosensitive layer is exposed through an upper and a lower mask 12, developed, and brought into a pattern. The patterned layer is subsequently used for etching the conductive layer into a pattern.

The known method described has the disadvantage that more than one mask is used. Such masks 12 are expensive and they have to be aligned relative to the body. The known method, accordingly, is complicated and expensive.

Figure 2:
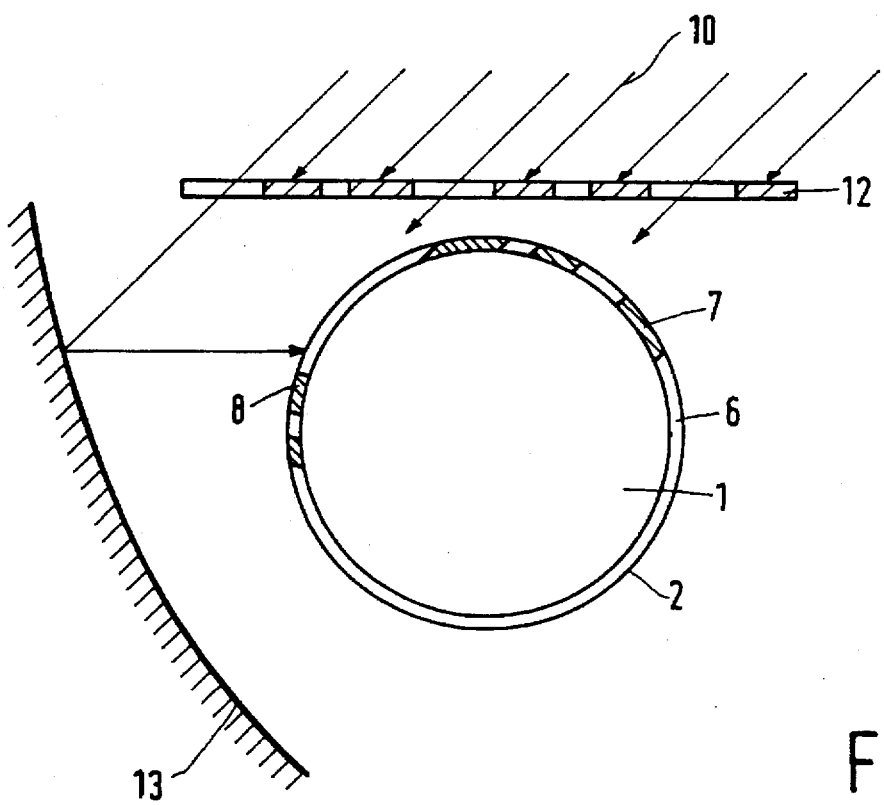
FIG. 2 is a lateral view of the method according to the invention whereby a radiation-sensitive layer on a sphere is irradiated.
Figure 3:
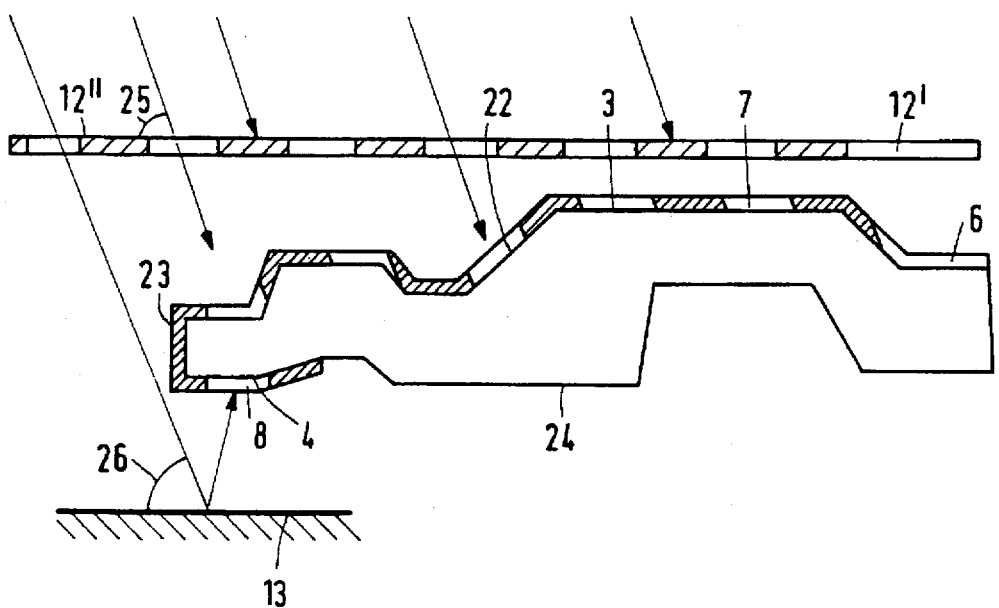
FIG. 3 is a lateral view of the method according to the invention whereby a radiation-sensitive layer on a body with a 3-D relief is irradiated.

According to the invention, the method is characterized in that a portion 7 of the radiation-sensitive layer 6 is irradiated directly through the mask 12, while another portion 8 is irradiated indirectly via the mask 12 and a surface 13 which reflects the radiation. FIGS. 1, 2, 3 show how the method according to the invention may be implemented for various shapes of the body 1. It is achieved by the method according to the invention that several potions 7, 8 of the radiation-sensitive layer 6 can be exposed by means of one mask 12. The alignment of one mask 12 and a reflecting surface 13 is simpler and cheaper than the use of several masks.

Such a method is particularly suitable for manufacturing devices such as, for example, electronic or optical systems. In these systems, bodies 1 are used in the form of, for example, printed circuit boards, connection foils of, for example, ICs or printed circuit boards, adapter plates between ICs and printed circuit boards, or bodies which block, reflect, or transmit radiation. Portions of these bodies 1 are for this purpose provided, for example, with a pattern of conductive or insulating tracks or a pattern which influences radiation. FIG. 1 shows an optical prism which, by means of the radiation-sensitive layer, is provided with a certain pattern which influences the light transmission through the prism. FIG. 2 shows a body 1 with a ball shape on which the pattern is provided. FIG. 3 shows a body 1 with a three-dimensional relief. The method employs a radiation-sensitive layer 6 which is sensitive, for example, to radiation 10 such as, for example, electrons, X-rays or light. Depending on the radiation 10 used, a radiation-sensitive layer 6 known per se is chosen. Portions 7, 8 of the radiation-sensitive layer 6, for example a lower, lateral, or upper side, are irradiated through a mask 12. The mask 12 used is a known mask, the nature of which depends on the radiation 10 used. The layer 6 is subsequently patterned. This may take place, for example, through dissolving in a chemical solvent of irradiated or non-irradiated portions of the radiation-sensitive layer 6, depending on whether this layer is positive or negative. The patterned layer 6 subsequently may alternatively be used, for example, for carrying out a treatment for the removal of material such as etching of those portions of the surface 2 of the body 1 where the radiation-sensitive layer 6 was removed. The patterned layer 6 may alternatively be used for selective growing of a layer in those locations where the layer 6 was removed, for example, on a nucleation layer present there. The layer 6 may itself be used, as applicable, for example as an insulating or light-impermeable layer.

Figure 4:
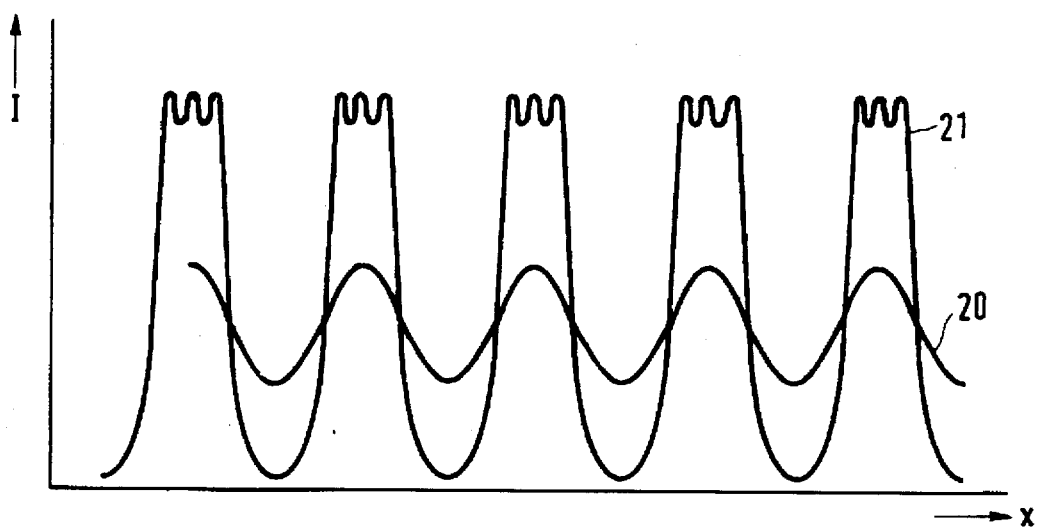
FIG. 4 is a graph of the relative intensity I of transmitted radiation as a function of a distance x, with the collimation angle as a parameter.

FIG. 1 shows how, in the method according to the invention, a distance 15 between mask 12 and surface 7 covered by the radiation 10 during direct exposure of the body 1 is usually not equal to a distance 16 between the mask 12, the reflecting surface 13, and the surface 8 to be exposed indirectly. Preferably, the radiation 10 comprises a substantially parallel beam. The differences in distance 15, 16 covered by the radiation 10 in the case of direct and indirect irradiation then do not or substantially not give rise to differences in resolution between directly and indirectly irradiated portions 7, 8, respectively, of the radiation-sensitive layer 6. Preferably, a collimation angle of the radiation 10 is smaller than 1°. In practice, no problems with resolution differences are found to arise then. FIG. 4 shows how a mask 12 with a pattern of lines of 50 μm width and a pitch of 100 μm is imaged from a distance 15, 16 of 2000 μm from the surface 2 of the body 1 when light with a wavelength of 400 nm and a collimation angle of 1.5° (curve 20) and 0.5° (curve 21) is used. A relative intensity I of the transmitted radiation is for this purpose plotted on the vertical axis in FIG. 4, and a distance x on the horizontal axis. It is clear that a sharp image is obtained with a collimation angle of 0.5°. Such a small collimation angle may be obtained through the use of, for example, a light source such as a Hg lamp or a laser as the radiation source. It is noted that an imaging accuracy is also influenced by the wavelength used. Diffraction effects will play a role in the case of light of a comparatively great wavelength, for example >400 nm. These diffraction effects, however, are of substantially the same importance both with direct illumination and with indirect illumination via the reflecting surface.

In the method, a portion 7, 8 of a radiation-sensitive layer 6 is exposed to radiation 10. In principle, there is no limitation as to the kind of radiation to be used in the method, as long as a mask, a reflecting surface, and a radiation-sensitive layer with development systems for irradiated or non-irradiated portions are available for the radiation used. For example, electrons, photons, or X-rays may be used as the radiation 10. Preferably, the method according to the invention is characterized in that the radiation 10 is optical radiation and the reflecting surface 13 comprises a mirror. The technique of illuminating a photosensitive layer 6 by means of optical radiation (photons) through a mask 12 is comparatively highly perfected, so that illumination systems, photosensitive materials for the radiation-sensitive layer 6, development systems, and aftertreatments (such as baking) for exposed or non-exposed portions of the light-sensitive layer 6 are available.

FIG. 3 shows an embodiment of the method which is characterized in that the portions 7, 8 of the radiation-sensitive layer 6 to be irradiated are provided on an upper side 22 and an opposed lower side 24, respectively, of the body 1, while the mask 12 is arranged adjacent the one side 22 and the reflecting surface 13 adjacent the other side 24, the radiation 10 being incident on the mask at an angle 25 and on the reflecting surface 13 at an angle 26. The potion 12' of the mask 12 used for irradiating the one side 22 directly is situated above the one side 22, while the mask 12 extends to laterally of the body 1. The portion 12" of the mask 12 laterally of the body 1 is used for illuminating the other side 24 via the reflecting surface 13. It is achieved thereby that the upper side 22 and lower side 24 of the body 1 can be provided with a pattern in a simple manner. An additional advantage is obtained when the mask 12 and the reflecting surface 13 are substantially parallel. Alignment of the mask 12 and reflecting surface 13 is simple then. The angles 25 and 26 enclosed by the radiation 10 with the mask 12 and with the reflecting surface 13, respectively, are then substantially the same. It is obvious that aligning of the reflecting surface 13 is easier than aligning of the mask 12. Unlike the mask 12, the surface 13 may be horizontally shifted, i.e. parallel to the mask 12, without any problems.

FIG. 3 shows a body 1 which has a lateral side 23 which connects the upper side 22 to the lower side 24, which lateral side 23 is also provided with a radiation-sensitive layer 6 which is irradiated through the mask 12 and patterned. It is possible then to make patterns on the body 1 which extend from the lower side 24 along a lateral side 23 to the upper side 22 of the body. Such a pattern on the lateral side may comprise, for example, a number of parallel conductor tracks. This offers major advantages, for example, in the realisation of conductor tracks which interconnect conductor patterns on an upper side 22 and conductor tracks on a lower side 24, such as used, for example, on adapter plates between an IC and a printed circuit board.

Figure 5:
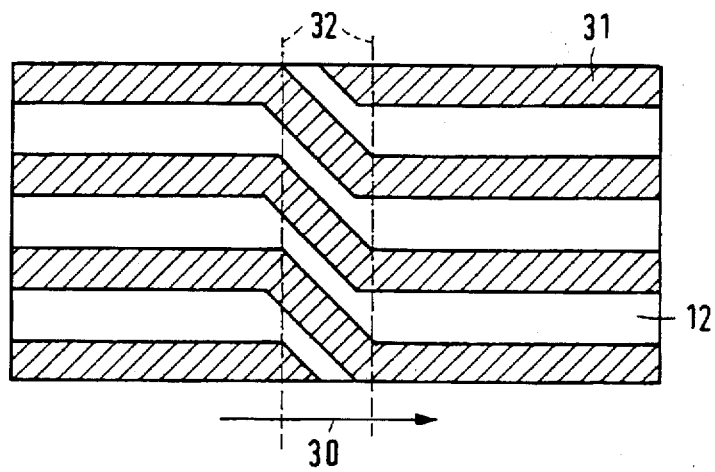
FIG. 5 is a plan view of a mask used in the method according to the invention.
Figure 6:
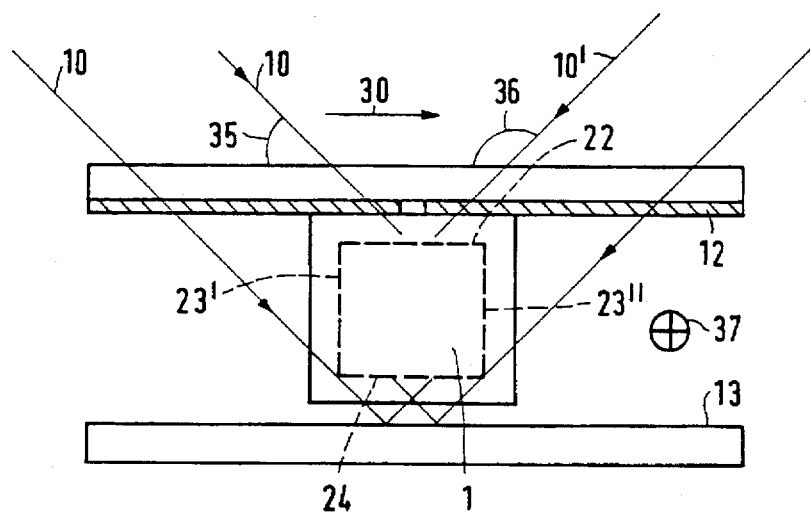
FIG. 6 is a cross-section in which a pattern is provided on an upper side, on lateral sides, and on a lower side of a coil body by the method according to the invention.
Figures 7A, 7B:
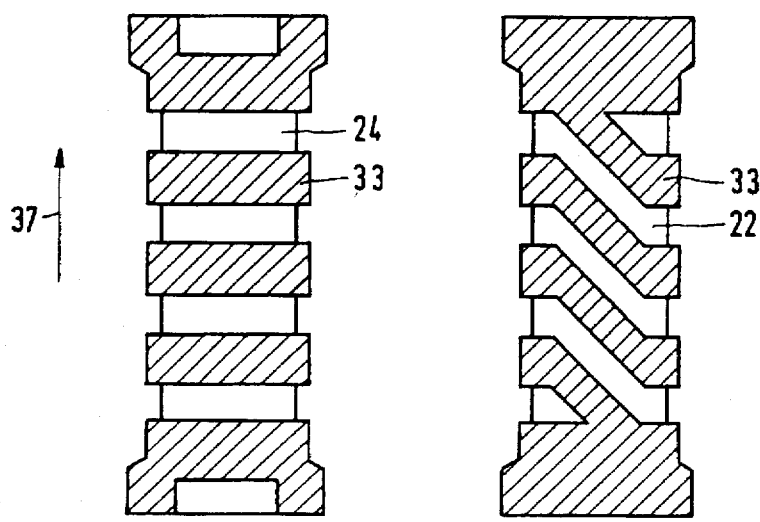
FIG. 7 shows a coil manufactured by the method according to the invention; 7A in bottom view, 7B in top view.

FIG. 5 is a plan view of a mask 12 with a pattern which runs mainly in one direction 30. Lanes 31 impervious to radiation have been provided on the mask here. When light is used as the radiation 10, such a mask 12 may be manufactured in known manner, for example, through etching of a chromium layer present on a glass substrate, the lanes 31 being manufactured from chromium, while the chromium is etched away from between the lanes 31. FIG. 6 shows in lateral view how the mask 12 of FIG. 5 is used in the method. Radiation 10, in this example light, is thrown onto the surface of a coil body 1 from more than one direction parallel in projection to the direction 30 of the pattern on the mask 12. Parallel here means that a projection onto the mask 12 of the path travelled by the radiation 10 runs parallel to the direction 30 of the pattern; the radiation runs as it were parallel to the plane of drawing of FIG. 6. The light 10 and 10' may be thrown onto the surface simultaneously or consecutively. FIG. 7 shows a body manufactured by this method, FIG. 7A showing a lower side 24 of the body and FIG. 7B an upper side 22. A plurality of parallel conductor tracks 33 are present on the body 1, running from an upper side 22 along a lateral side 23 to a lower side 24 of the body 1. A conductor pattern on an upper side 22 is thus electrically connected through via a lateral side 23 to a conductor pattern on a lower side 24. To manufacture the coil of FIG. 7, light 10 and 10' is directed at different angles 35, 36 at the mask 12 and the reflecting surface 13 from various directions in order to make a conductor track 33, for example, on a left-hand side 23' as well as on a right-hand side 23" of a body 1. In practice, angle 36 is usually taken to be equal to (180°–angle 35). FIGS. 6 and 7 show a body 1 of elongate shape, the coil body 1, where the direction 30 of the pattern on the mask 12 is substantially perpendicular to the longitudinal direction 37 of the body. Owing to the elongate shape, the dimensions of the body 1 in the direction 30 of the pattern on the mask 12 are comparatively small. A pattern may then be provided comparatively easily on the body 1, both on an upper side 22 and on a lower side 24. FIGS. 5 to 7 show how a coil is advantageously made by this method. For this purpose, a metal layer is provided on the body 1 on which the radiation-sensitive layer, in this case a negative photoresist, is provided. This radiation-sensitive layer is subsequently patterned by a method according to the invention and used for patterning the metal layer through etching. The radiation-sensitive layer is then removed. A copper layer may be taken as the metal layer, light for the radiation, and a known photoresist for the radiation-sensitive layer. The mask 12 as shown in FIG. 5 comprises a pattern of parallel lines 31 having one direction 30 and offset in one location 32. Owing to this offset, a continuous conductor track is created on the body since the offset interconnects a conductor track to a next conductor track each time. To illuminate both a left-hand side 23' and a right-hand side 23", the radiation-sensitive layer is illuminated from two directions 10, 10' (see FIG. 6). The light 10, 10' is then incident on the mask 12 parallel to the direction 30 at two angles 35 and 36. In location 32, where the mask pattern is offset, a widening of the pattern takes place then in the radiation-sensitive layer. Accordingly, the spacing between the tracks 30 on the mask is preferably taken to be smaller there. The pattern in the radiation-sensitive layer 6 then has the same width everywhere nevertheless. A conductor track 33 is thus manufactured on the elongate body 1 running over the upper side 22, lower side 24, and lateral sides 23 of this body 1, such that the conductor track surrounds the body 1 helically. The continuous helical conductor track 33 acts as the winding of a coil. A coil made in such a manner can be manufactured much more cheaply. In addition, coils of very small dimensions, which cannot be made through winding of wire around a body, can be manufactured by the method according to the invention.

Although certain techniques were used in the embodiments for the irradiation, the mask, the radiation-sensitive layer, and the development of this layer, it will be obvious that other known techniques may be used without detracting from the invention. Thus, for example, a conductor track may be provided in that first a metal layer is provided, and a radiation-sensitive layer is provided thereon and subsequently patterned. The conductor pattern may alternatively be provided in that first a radiation-sensitive layer is patterned by the method according to the invention and subsequently a conductor is deposited selectively on surface areas not covered by the radiation-sensitive layer, possibly with the use of a nucleation layer, or in that the radiation-sensitive layer is used in a lift-off process. It is possible to use a positive or a negative radiation-sensitive layer, i.e. a layer which becomes soluble or insoluble upon irradiation. Alternatively again, the radiation-sensitive layer 6 may be directly used under circumstances as, for example, an optical inscription, or a pattern for, for example, an optical mask or as a pattern of insulating tracks.

It is also possible in the method according to the invention to provide, for example, an upper side 22, a lateral side 23, and a portion of a lower side 24 with a patterned radiation-sensitive layer (see FIG. 3) via the mask 12 and the mirror 13. A second mask may then be used for providing a further portion of the lower side 24 with a patterned radiation-sensitive layer. This latter method is advantageous in particular for bodies 1 having a comparatively large upper and lower side and a comparatively small lateral side 23, for example, large flat plates.

What is claimed is:

1. A method of manufacturing a device provided with a body having a surface, at least a portion of the surface having a radiation-sensitive layer, the method comprising positioning a mask relative to the surface and irradiating first and second portions of the radiation-sensitive layer through the positioned mask using substantially collimated radiation, said first portion of the radiation-sensitive layer being irradiated directly through the positioned mask using a first part of the radiation, and said second portion of the radiation-sensitive layer being irradiated indirectly through the positioned mask using a second part of the radiation, said second part being incident on the second portion after reflection from a reflector, said first and second portions of the radiation-sensitive layer being provided on an upper and an opposed lower side of the body, while the mask is adjacent one of said sides and the reflector is disposed in association with the other of said sides, the radiation being incident on the mask and on the reflector at an angle.

2. A method as claimed in claim 1, wherein the collimation angle of the radiation is smaller than 1°.

3. A method as claimed in claim 1, wherein the radiation comprises optical radiation and the reflector comprises a mirror.

4. A method as claimed in claim 1, wherein the mask and the reflector are substantially parallel.

5. A method as claimed in claim 1, wherein the body is provided with a lateral side which connects the upper and lower sides, said lateral side being provided with a radiation-sensitive layer which is irradiated through the mask or via the reflector.

6. A method as claimed in claim 1 wherein the mask comprises a pattern which runs mainly in one direction, while radiation is thrown onto the surface from more than one direction parallel in projection to the direction of the pattern.

7. A method as claimed in claim 6, wherein the body has an elongate shape, while the direction of the pattern on the mask is substantially perpendicular to the longitudinal direction of the body.

8. A method as claimed in claim 7, wherein a coil is made through the use of the radiation-sensitive layer patterned on an elongate body for manufacturing a conductor track which extends over the upper, lower, and lateral sides of the body and surrounds the body helically.

9. A method as claimed in claim 1, wherein a conductive layer, which is patterned by means of the radiation-sensitive layer, is present on the body.

* * * * *